United States Patent [19]
Wittman

[11] Patent Number: 5,251,179
[45] Date of Patent: Oct. 5, 1993

[54] APPARATUS AND METHOD FOR EXTENDING BATTERY LIFE

[75] Inventor: Brian A. Wittman, Indianapolis, Ind.

[73] Assignee: AT&T Bell Laboratories, Murray Hill, N.J.

[21] Appl. No.: 677,032

[22] Filed: Mar. 29, 1991

[51] Int. Cl.[5] .......................... G11C 11/00; H02J 9/00
[52] U.S. Cl. ...................... 365/227; 307/66; 365/229
[58] Field of Search ............... 365/226, 227, 228, 229; 307/64, 66; 379/413

[56] References Cited

U.S. PATENT DOCUMENTS

| | | | |
|---|---|---|---|
| 4,122,359 | 10/1978 | Breikss | 365/229 X |
| 4,272,650 | 6/1981 | Bolgiano et al. | 307/66 X |
| 4,279,020 | 7/1981 | Christian et al. | 364/900 |
| 4,441,031 | 4/1987 | Moriya et al. | 307/66 |
| 4,488,006 | 12/1984 | Essig et al. | 379/387 |
| 4,653,088 | 3/1987 | Budd et al. | 379/165 |
| 4,715,016 | 12/1987 | Lamiaux et al. | 365/229 |

FOREIGN PATENT DOCUMENTS 2078466 6/1981 United Kingdom .

OTHER PUBLICATIONS

Specification Sheet—Dallas Semiconductor DS1234 Conditional Nonvolatile Controller Chip—Jul. 4, 1990—pp. 635-637.

*Primary Examiner*—Steven Mottola
*Assistant Examiner*—Seung Ham
*Attorney, Agent, or Firm*—Michael A. Morra

[57] ABSTRACT

An electrical product uses a small battery, which is permanently soldered into the product, to protect certain critical circuits such as volatile memory when primary power is removed. The life of such a battery is extended by disabling it during the time interval between factory testing and first use by a customer so that it does not drain during transportation and storage. During factory testing, instructions stored in volatile memory are delivered to a microprocessor that cause it to generate a unique signal that resets a switch and thereby disables the battery. These instructions are down-loaded into the volatile memory and executed as part of the final factory test procedure. When the primary power source is removed from the product following factory test, these instructions are lost (erased) because the battery is disabled at this time. The microprocessor is arranged to set the switch, and thereby enable the battery, each time primary power is subsequently applied or removed from the product.

14 Claims, 3 Drawing Sheets

APPARATUS AND METHOD FOR EXTENDING BATTERY LIFE

TECHNICAL FIELD

This invention relates to power supply circuits and more particularly to apparatus for controlling the application of power in electronic equipment.

BACKGROUND OF THE INVENTION

Modern electronic equipment has become so sophisticated in recent years that even the simplest products now include microprocessors and memories. Being price competitive has dictated the use of inexpensive random access memories (RAM) for storing large amounts of data. Although RAM devices do not consume a great deal of power, data are lost when primary power is completely removed—as is the situation during commercial power outage, battery replacement, and inadvertent removal of a power cord. While this may not present a serious problem in some products, it is not desirable to require customers to reprogram their feature-rich telephone sets whenever they are unplugged and moved to a new location. Likewise, it is undesirable to update digital clocks and radios in similar circumstances.

One common approach to dealing with this problem is to provide a backup battery that keeps memory intact whenever primary power is lost. Such batteries are generally customer purchased and installed since they are seldom included with the product. Unfortunately, replaceable batteries usually require a battery test circuit which adds to product cost. Replaceable batteries further require storage compartments that increase the size and cost of such products, and must be positioned to facilitate customer access. Battery compartment doors are frequently lost or broken, which not only detracts from product appearance, but also eliminates needed support for the battery. Accordingly, it is desirable to avoid the use of customer-installable batteries and associated battery compartments.

Another approach to dealing with this problem is to permanently install a battery in the product so that the need for customer access is eliminated. Unfortunately, battery shelf life can be a problem, particularly if the battery is being drained before the product is even sold. Indeed, the product may sit on a shelf in a retail store or in a warehouse for more than a year before it is purchased by the customer. During this time, exposure to elevated temperatures is possible, particularly during warehouse storage; and it is at these elevated temperatures that current requirements increase dramatically for both JFET and MOS devices thereby draining permanently-installed batteries at an unacceptably high rate.

Yet another approach to the problem of keeping volatile memory alive when primary power is absent in the use of batteries that can be re-charged during the normal operation of the product. Rechargeable (Nickel-Cadmium) batteries are relatively expensive, however, and in telephone-line powered equipment receive only a small amount of charging current when the telephone handset is off-hook, and practically none when it is on-hook. Notwithstanding the fact that such batteries can be re-charged, they have reliability problems and eventually wear out. A variation on this approach is the use of a large capacitor which is charged whenever primary power is present. Unfortunately, such capacitors do not store sufficient energy to provide reliable backup power for extended time periods.

Special controllers exist (e.g., DS1234 Conditional Nonvolatile Controller Chip from Dallas Semiconductor) that protect volatile memory from power loss via software-controlled switches. Delivery of an "enable" code to the controller causes the switch to operate, and delivery of a "disable" code causes it to release. It is known to use such switches to enable/disable a battery during shipment or storage. Unfortunately, such switches can be inadvertently disabled, enable codes are relatively complex, and these codes cannot be stored in volatile memory if battery power is to be conserved during shipment or storage.

SUMMARY OF THE INVENTION

In accordance with the invention, a battery is used to supply electrical power to a power-using device in an electronic product when its primary power source is removed. A switch is set to connect the battery to the device, and is reset to disconnect the battery therefrom. Means are provided to set the switch during use of the product. Means are also provided to preclude the switch from being reset more than one time.

In an illustrative embodiment of the invention, the power-using device is a volatile memory in which a predetermined signal is stored. The predetermined signal causes the switch to be reset—thereby removing power from the volatile memory and erasing the predetermined signal itself. Accordingly, the switch cannot be inadvertently reset again.

In the illustrative embodiment of the invention, the switch is reset during factory testing, and is set each time primary power is applied to, or removed from, the product. By resetting the switch at this time, battery life is extended by eliminating drain during product storage. Once the battery is enabled it remains enabled thereafter, so that, for example, customer-entered data need not be re-entered if primary power is ever lost.

Advantageously, a lithium battery is used in the invention, and is soldered onto a circuit board within the product. Such batteries are machine-insertable in much the same manner as other printed wiring board components. Battery compartments and customer inconvenience are eliminated, product cost and size are reduced, and product design is simplified and improved by eliminating the need for a conveniently positioned battery door. Also, since the battery is non-replaceable, battery test circuitry is not required.

DETAILED DESCRIPTION

In some ways, the present invention is similar to the practice of adding acid to a car battery in order to activate it at the time the battery is purchased. As a practical matter, this assures that aging will not commence prior to the time of purchase. In like manner, the battery of the present invention is not activated until the product which contains the battery is first used by a customer. First use is determined, in the present invention, by electronic circuitry that responds to the application of primary power to enable the battery. Primary power may come from a variety of sources including, but not limited to, commercial power (115 Volt AC), telephone line power (48 Volt DC), or even batteries other than the one being activated in the present invention. Note that the present invention seeks to extend the life of the battery which is used after the primary source of power is removed. Heretofore, the useful life of such batteries has been shortened by the current drain that occurred even before the product was sold. Since the primary source of power is generally removed during transportation and storage of the product, batteries are drained while preserving data that may not be useful to the operation of the product. Furthermore, it is important that after the battery is enabled, special precautions be taken to assure that it not be disabled again.

Figure 1:
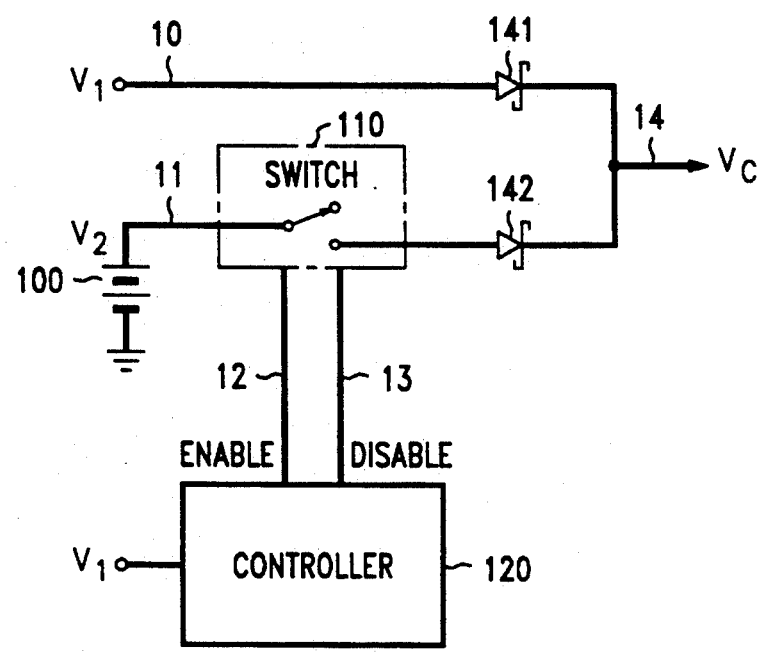
FIG. 1 discloses, in block form, a simplified embodiment of the present invention.

FIG. 1 discloses, in block form, a simplified embodiment of the invention wherein a constant source of voltage $V_c$ is supplied over line 14 to critical circuitry within an electronic product. Voltage $V_c$ remains present even after primary power $V_1$, on line 10, is removed. Critical circuitry includes, for example, volatile memory or a microprocessor which would be shut down by the removal of power and thereby adversely affect product operation. The loss of volatile memory might require the customer to reset the time on a clock—which is only a minor inconvenience; however, it might involve having to re-enter many telephone numbers and associated names in certain automatic telephone dialing equipment. Although non-volatile memory devices exist, they are substantially more expensive and generally have less storage capability than conventional RAMs.

Battery 100 is connected to switch 110 over line 11. Switch 110 is enabled or disabled by controller 120 over lines 12, 13 respectively. Diodes 141, 142 steer current flow from the primary power source or from the battery 100 toward the ultimate load while precluding current flow between the primary power source and battery. In order to prevent drain on battery 100 during normal operation, its voltage magnitude $V_2$ is chosen to be less than $V_1$, but still large enough to provide adequate power to protect the critical circuitry. In the illustrative embodiments of FIG. 1 and FIG. 2, $V_1=5$ volts and $V_2=3$ volts.

Controller 120, shown in FIG. 1, enables switch 110 via a signal on line 12 each time $V_1$ is applied to the controller. However, controller 120 only disables switch 110 during factory testing of the product in response to a special test procedure. Thus, after factory testing, battery 100 remains disabled until primary power $V_1$ is next applied to the product—which presumably occurs during its first use by the customer.

Figure 2:
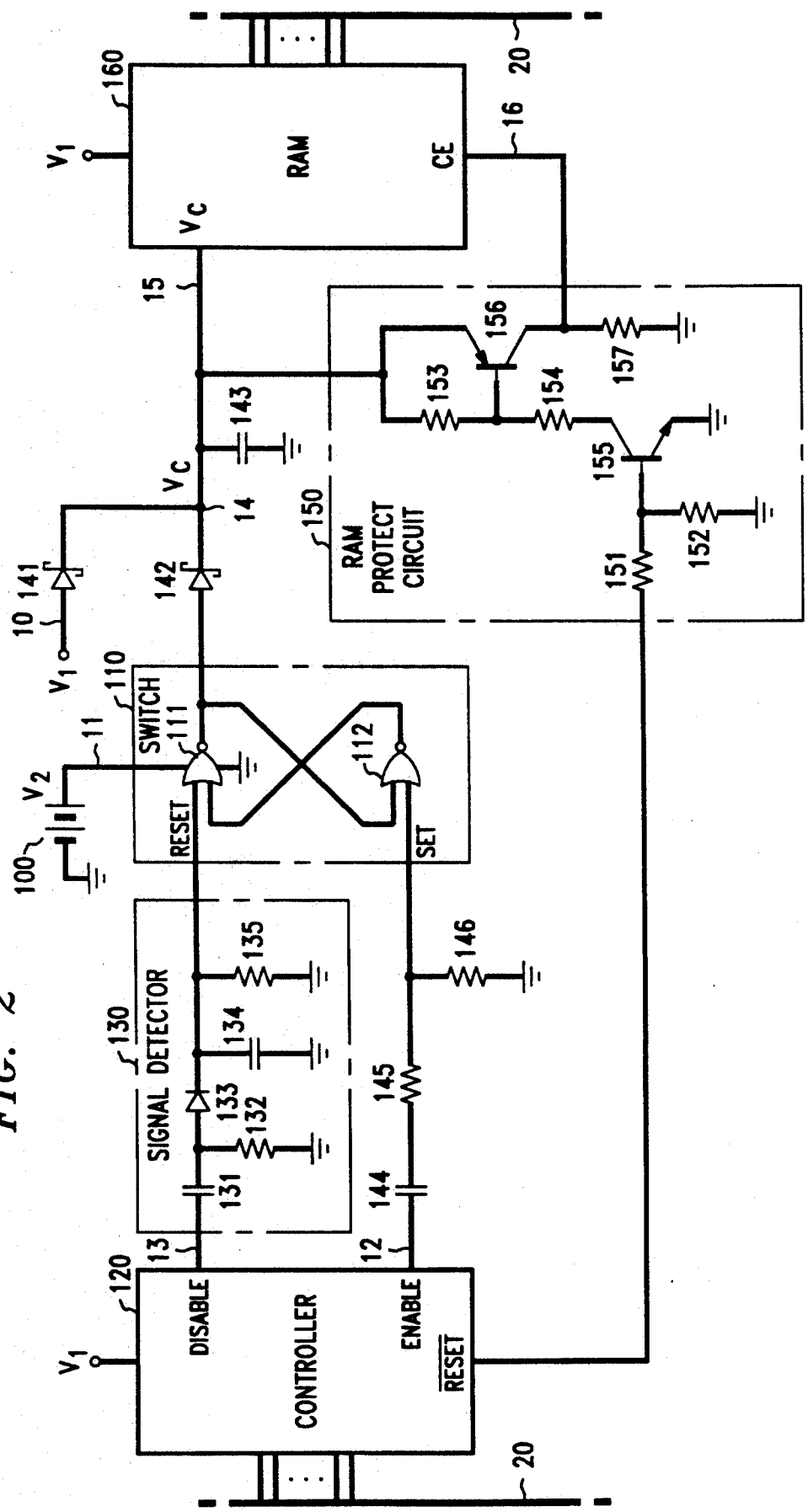
FIG. 2 discloses a detailed schematic of the invention showing the various circuits used in its construction.

Referring now to FIG. 2, there is disclosed a more detailed schematic of an illustrative embodiment of the invention showing the various circuits used in its construction. In particular, controller 120 is a microprocessor used in the normal operation of the product. Certain of its outputs, however, are dedicated to enabling and disabling battery 100. A suitable device is the Mitsubishi M37700SAFP 16-bit CMOS microprocessor which is used with an 8-bit external data bus 20.

Controller 120 communicates with data bus 20 and hence with random access memory (RAM) 160 which, illustratively, is a single 131 k×8 static RAM which supplies all of the RAM needs for the product including the storage of customer-supplied information which, if lost during a power outage, would cause substantial inconvenience. RAM 160 maintains data integrity down to $V_c=2$ volts. Representative RAMs for use in the present invention include: TC551001FL-10 (Toshiba), HM628128LFP-10 (Hitachi), μPD431000GW-10L (NEC), and M5M51008FB-10L (Mitsubishi). All of these devices require a worst case standby current of 50 microamperes at $V_c=3$ volts although typical currents are expected to be less than 10 microamperes since the product will not experience an ambient temperature close to 70° C.

Battery 100 is a 3-volt lithium battery having approximately 180 mA-hr capacity. A suitable device is the CR2032-THB (Toshiba) or equivalent. The 180 mA-hr capacity provides approximately 2 years of power fail backup assuming a 10 microampere RAM current drain. This long capability is used because battery 100 is not customer-replaceable, and because the battery will continue to be discharged during prolonged periods of product storage and non-use (e.g., customer stores the product in a closet for 6 months). Preventing battery drain during the initial pre-use storage and transportation interval is generally accomplished via switch 110 which is disabled only during factory test, and enabled by the microprocessor 120 during power up. In the illustrative embodiment of the invention, the battery switch is never again disabled after power up.

Figure 3:
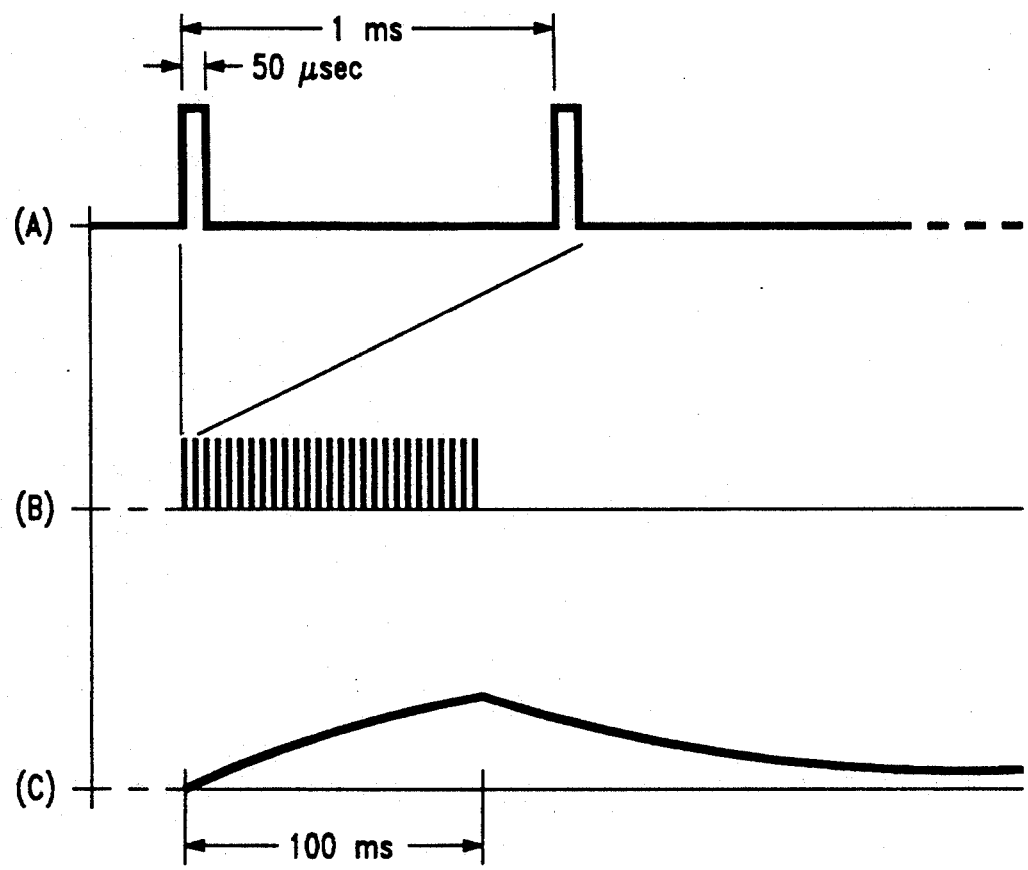
FIG. 3 discloses various waveforms associated with disabling the battery switch of the present invention.

During factory testing, instructions stored in RAM 160 are delivered to controller 120 over data bus 20. These instructions cause controller 120 to generate a predetermined signal on line 13 that causes switch 110 to become disabled. In the embodiment of the present invention, the predetermined signal comprises a stream of positive-going, 50-microsecond pulses that occur at a 1000 Hz rate such as shown in FIG. 3A. This pulse stream is present for a duration of 100 milliseconds or more in the manner illustrative shown in FIG. 3B. Acceptable tolerances for the pulse width and repetition rate are ±20%. Signal detector 130 responds to this pulse stream to reset battery switch 110. The instructions (software code) required to generate this pulse stream do not reside anywhere in the software of the product delivered to the customer. Instead, the required instructions are down-loaded into RAM 160 and executed as part of the final factory test procedure. When primary power source $V_1$ is removed from the product following factory test, these down-loaded instructions are lost (erased) because battery 100 is disabled at this time. Such precautions make it virtually impossible to accidentally disable the switch under normal system operation.

Signal detector 130 is designed to provide a positive output voltage on capacitor 134 in response to a large number of positive-going pulses at its input 13. The signal detector includes a high-pass filter section comprising capacitor 131 and resistor 132 whose time constant is 1 millisecond. This time constant precludes a constant-magnitude positive voltage on line 13 from disabling switch 110. Indeed, signal detector 130 precludes switch 110 from ever being disabled because it only allows the predetermined signal to disable the switch—a predetermined signal that can no longer be generated.

Diode 133 only admits positive-going pulses to a low-pass filter section of the signal detector which comprises capacitor 134 and resistor 135 whose time constant is 75 milliseconds (approximately the time required to charge capacitor 134 to a voltage sufficient to reset switch 110). Capacitor 134 accumulates charge that is delivered by the stream of pulses and its voltage slowly builds, as illustratively shown in FIG. 3C, until it is large enough to reset switch 110. Capacitor 134 functions as an "integrator" that accumulates charge while resistor 135 allows charge to leak away so that miscellaneous pulses on input 13 to the signal detector do not accumulate over long time periods and thus cause the switch to reset inadvertently.

Signal detector 130 therefore generates a reset signal to disable switch 110 in response to a predetermined signal from the controller 120. In the preferred embodiment of the invention, the predetermined signal is a continuous stream of positive-going pulses, although other predetermined signal patterns can be used in connection with circuits designed to respond to such patterns by disabling the battery in order to extend its life.

Signal detector 130 cooperates with controller 120 to assure that the battery is not disabled at undesirable times. In the preferred embodiment, it is only desirable to disable the battery during the time period between factory testing and first customer use. That is why the software in RAM 160, which is used during factory testing to disable the battery, is discarded by the removal of all power from the RAM after factory testing.

Switch 110 comprises a pair of CMOS NOR gates 111, 112 connected as a set/reset flip flop. NOR gates provide a logical "0" output when either of its inputs are in the logical "1" state; otherwise its output is a logical "0". In the present embodiment, logical "1" corresponds to a positive voltage and logical "0" corresponds to zero volts. Here, battery 100 supplies positive voltage $V_2$ to the Drain voltage input 11 of the device containing NOR gates 111, 112; and ground (zero volts) is connected to the Source voltage input of the chip. A suitable device is the CD4001B CMOS NOR gate. Flip flop 111, 112 is reset (disabled) in response to a positive voltage input from signal detector 130 to NOR gate 111. The reset condition is unique and only exists between factory test and first use. The flop flop is set (enabled) in response to positive-going signal transitions on output lead 12 of the controller 120. The network comprising capacitor 144 and resistors 145, 146 delivers positive-going signal transitions to NOR gate 112 thereby setting the flip flop. When the flip flop is set, voltage $V_2$ is present on output line 12 of switch 110 so that battery 100 is enabled to provide a source of backup voltage to RAM 160. Positive-going signal transitions are provided on line 12 at the output of the controller when primary power $V_1$ is applied to the controller, and again during a power-down sequence when loss of primary power $V_1$ is detected. This redundancy assures that flip flop 111, 112 is set when primary power is lost.

In the preferred embodiment of the invention, switch 110 is an electronic switch (a bistable flip flop). Nevertheless, a mechanical switch can be used with equivalent results. Indeed relatively small and inexpensive switches exist which are operated or released by the magnetic field produced by positive or negative pulses of current. The choice between electrical and mechanical switches is a decision for the circuit designer after considering such factors as cost, size, operating power and voltage drop across the switch.

Power is supplied to RAM 160 on its input line 15 from the primary power source $V_1$ which is delivered via Schottky diode 141 and capacitor 143 which provides filtering. When $V_1$ is present, $V_c$ is approximately equal to 5 volts because the voltage drop across the Schottky diode is small (approximately 0.2 volts). Schottky diode 142 is reverse biased at this time ($V_2 = 3$ volts) and behaves like an open circuit. In the event that $V_1$ is absent, such as during power failure or the removal of batteries (when batteries are used for primary power), battery 100 delivers electrical current to the RAM via Schottky diode 142 which is now forward biased and thus behaves like a short circuit.

Protection of RAM 160 is further enhanced by RAM protect circuit 150 comprising components 151-157. In order to write new information into the RAM, a chip enable (CE) input on line 16 is kept at 5 volts. If primary power is present, the $\overline{\text{RESET}}$ output signal from controller 120 is at the 5 volt level and is presented to the voltage divider comprising resistors 151, 152. Transistor 155 turns on when the $\overline{\text{RESET}}$ signal exceeds 4 volts.

It is well known, in microprocessor-controlled products, to execute a special sequence of instructions during power-down (i.e., the time when power is being lost). Loss of power is generally detected by one or more sensors that detect the condition that the supply voltage has fallen below some predetermined magnitude. Large capacitors store enough charge to allow the sequence of instructions to be executed thereby assuring that the product will be shut down in an orderly manner. Examples wherein controlled power-down procedures are followed are shown in U.S. Pat. No. 4,279,020 for a Power Supply Circuit For A Data Processor, to Christian et al.; and U.S. Pat. No. 4,488,006 for Apparatus For Controlling The Application Of Telephone Line Power In A Telephone Set, to Essig et al. These examples can be advantageously applied to the present invention to set the battery switch 110 (shown in FIG. 2) when loss of power is detected. Since the drain on battery 100 is virtually zero when primary power is present, it probably does not matter whether the battery switch is set when power is first applied to the product or when power is removed therefrom. Nevertheless, the present invention includes instructions that set the battery switch each time primary power is removed. Such instructions cause a positive-going pulse to be applied to line 12 (FIG. 2) in order to set the switch.

Although a particular embodiment of the invention has been shown and described, it is understood that various modifications are possible within the spirit and scope of the invention. These modifications include, but are not limited to, the use of a mechanical switch rather than an electronic switch to enable/disable the battery, the use of batteries that are not permanently connected to the product, and the use of conventional circuitry (rather than software instructions) to generate a signal needed to set the switch. Such conventional circuitry might, for example, be responsive to an increase/decrease of power supply voltage for generating a pulse to set the switch.

I claim:

1. An electrical product including a battery for supplying electrical power to a power-using device when its primary source of electrical power is absent, the product further including switching means having set and reset states, the switching means interconnecting the battery and the device in its set state and disconnecting the battery from the device in its reset state, characterized by:

means responsive to the application of the primary source to the electrical product for setting the switching means; and means for precluding the switching means from being reset more than one time.

2. The invention of claim 1 wherein the power-using device comprises a volatile memory for storing data, said data being lost when electrical power is removed from the volatile memory.

3. The invention of claim 1 wherein the precluding means comprises a volatile memory for storing software instructions to generate a predetermined sequence of binary digits, signal generating means for generating the predetermined sequence of binary digits, and signal detecting means responsive to the predetermined sequence of binary digits for delivering a reset signal to the switching means; whereby removal of all electrical power from the volatile memory effectively eliminates the ability to reset the switching means.

4. The invention of claim 3 wherein the predetermined sequence of binary digits comprises a continuous stream of pulses at a substantially constant rate, the stream continuing for a duration that is substantially longer than the period of said constant rate.

5. The invention of claim 3 wherein the signal detecting means includes a high-pass filter for passing the high frequency components of the predetermined sequence of binary digits, a diode for rectifying said high frequency components, and low-pass filter for integrating the rectified high frequency components; whereby increments of electronic charge are accumulated in such a manner that only a narrow class of signals can cause the reset signal to be generated.

6. The invention of claim 1 wherein the battery comprises a lithium battery.

7. The invention of claim 1 wherein the switching means comprises an electronic switch.

8. The invention of claim 7 wherein the electronic switch is a bistable circuit.

9. An electrical product responsive to a primary source of electrical power for operating a power-using device, the product including a battery for supplying power to the device when the primary source is absent, and switching means for connecting the battery to the device when the switching means is set and for disconnecting the battery from the device when the switching means is reset,
characterized by:
means responsive to the removal of primary power from the electrical product for setting the switching means; and
means for precluding the switching means from being reset more than one time.

10. The invention of claim 9 wherein the power-using device comprises a volatile memory for storing data, said data being lost when electrical power is removed from the device.

11. The invention of claim 9 wherein the precluding means comprises volatile memory means for storing software instructions for generating a predetermine sequence of binary digits, and signal detecting means responsive to the predetermined sequence of binary digits for delivering a reset signal to the switching means; whereby removal of all power from the volatile memory means effectively eliminates the ability to reset the switching means.

12. An electrical product including a primary source of electrical power for operating a power-using device, a secondary source of electrical power for operating the device when the primary source is absent, and switching means for connecting the secondary source to the device when it is enabled and disconnecting the secondary source from the device when the primary source is disabled,
characterized by:
volatile memory means for storing software instructions for generating a predetermine sequence of binary digits one time only;
signal detecting means responsive to the predetermined sequence of binary digits for delivering a reset signal to the switching means; and
means for enabling the switching means when primary power is applied to the electrical product.

13. An electrical product including a primary source of electrical power for operating a power-using device, a secondary source of electrical power for operating the device when the primary source is absent, and switching means for connecting the secondary source to the device when it is enabled and disconnecting the secondary source from the device when the primary source is disabled,
characterized by:
volatile memory means for storing software instructions for generating a predetermined sequence of binary digits one time only;
signal detecting means responsive to the predetermined sequence of binary digits for delivering a reset signal to the switching means; and
means for enabling the switching means when primary power is removed from the electrical product.

14. In an apparatus having a primary source of electrical power and a backup battery for providing power to a power-consuming device, a method for extending the life of the battery comprising the steps of:
executing instructions, stored in a memory, which cause a high impedance electrical path to be created between the battery and the power-consuming device during a first time period in order to eliminate battery backup for the power-consuming device;
erasing the instructions stored in the memory which caused the high impedance electrical path to be created;
removing the primary source of electrical power from the apparatus; and
changing the high impedance electrical path to a low impedance electrical path after the primary source of electrical power is reapplied to the apparatus in order to restore battery backup for the power-consuming device.

* * * * *